United States Patent [19]

Morgan

[11] 3,936,530
[45] Feb. 3, 1976

[54] METHOD FOR PREPARING COATINGS USING CURABLE SOLID STYRENE-ALLYL ALCOHOL COPOLYMER BASED POLYENE AND POLYTHIOL COMPOSITIONS

[75] Inventor: Charles R. Morgan, Silver Spring, Md.

[73] Assignee: W. R. Grace & Co., New York, N.Y.

[22] Filed: Dec. 18, 1973

[21] Appl. No.: 425,748

Related U.S. Application Data

[62] Division of Ser. No. 250,729, May 5, 1972, Pat. No. 3,832,421.

[52] U.S. Cl. .................. 427/43; 96/35.1; 96/36.2; 156/230; 156/272; 204/159.14; 260/859 R; 260/874; 427/41; 427/53; 427/44; 427/54; 427/273; 428/901
[51] Int. Cl.² .............................................. B05D 3/06
[58] Field of Search .... 117/93.31, 161 KP, 161 UC, 117/8; 260/874, 859 R, 79.5 R, 79.5 NV; 96/35.1, 36.2; 156/272, 230; 204/159.14; 427/43, 44

[56] References Cited
UNITED STATES PATENTS

| | | |
|---|---|---|
| 2,630,430 | 3/1953 | Shokal et al. ...................... 260/23 S |
| 3,340,236 | 9/1967 | Greenlee et al. ................. 260/78.4 R |
| 3,615,450 | 10/1971 | Werber et al. ....................... 96/35.1 |
| 3,619,393 | 11/1971 | Stahly .............................. 204/159.15 |
| 3,645,730 | 2/1972 | Frank et al. ............................. 96/28 |
| 3,719,638 | 3/1973 | Huemmer et al. ............ 260/77.5 CR |

*Primary Examiner*—John H. Newsome
*Attorney, Agent, or Firm*—Giedre M. McCandless

[57] ABSTRACT

A method for preparing coatings, particularly imaged surfaces such as photoresists, printing plates, etc. which includes coating the surface of a substrate with a solid curable composition containing styrene-allyl alcohol copolymer based polyene and polythiol components, curing the composition by exposing selected areas thereof to a free radical generating source, e.g. actinic radiation and removing e.g. by dissolving the uncured, unexposed areas of the curable composition to bare the underlying substrate. The solid polyene component is a reaction product of a copolymer of styrene-allyl alcohol and an unsaturated isocyanate e.g. allyl isocyanate or an unsaturated acid e.g. acrylic acid. The solid polythiol is a reaction product of a copolymer of styrene-allyl alcohol and a mercapto carboxylic acid, e.g. β-mercaptopropionic acid.

20 Claims, No Drawings

METHOD FOR PREPARING COATINGS USING CURABLE SOLID STYRENE-ALLYL ALCOHOL COPOLYMER BASED POLYENE AND POLYTHIOL COMPOSITIONS

This is a division of application Ser. No. 250,729, filed May 5, 1972, now U.S. Pat. No. 3,832,421.

BACKGROUND OF THE INVENTION

This invention relates to a solid curable polymer composition. More particularly, this invention relates to a solvent soluble solid polyene-solid polythiol curable composition, method of preparing the same, as well as curing the solid polymer composition in the presence of a free radical generator to solid, cross-linked solvent-insoluble materials. More specifically, this invention relates to solid photoresists and method of preparing same.

It is known that polyenes are curable by polythiols in the presence of free radical generators such as actinic radiation to solid polythioether containing resinous or elastomeric products. In these prior art polyene-polythiol curable systems, either both the polyenes and polythiol were liquids, or one of the polymeric components was solid and the other liquid. Both liquid curable systems and the liquid-solid curable polymeric systems possess certain limitations and disadvantages. The use of curable liquid systems in preparation of photoimaged surfaces such as relief printing plates and photoresists have many undesirable features such as time consuming liquid coating operation which involves the use of cumbersome and additional apparatus, particularly expensive liquid dispensing equipment. A particular disadvantage of the liquid polymer systems is the resulting limited resolution during the photo-imaging step, since it is necessary to maintain an air gap between the image, e.g., photographic negative and the liquid photocurable composition coated on a surface which is to be imaged in order to avoid marring the image and allowing its reuse.

Additionally, in the manufacture of certain printed circuits, when various photosensitive polymers are applied as liquid photoresists they clog "thru-holes" in double sided or multi-layer printed circuits.

On the other hand, in the liquid-solid curable system, the components are often incompatible, are not easily workable, or do not produce dry films.

The novel solid curable polymer system of the present invention overcomes the numerous defects of prior art materials. Both components of the curable composition, the solid polyene and solid polythiol are compatible materials. This curable composition can be compounded easily by mixing the polyene and polythiol and be rapidly cured, particularly photocured in a solid state. This solid polyene-polythiol mixture is a versatile photocurable composition which is particularly useful in preparation of solid photoresists, solid relief or offset printing plates, coatings and the like. The subject photocurable polyene-polythiol composition readily forms a dry solid film material which can be easily handled and stored prior to utilizing it in photocuring processes such as photoresist formation. This dry film polymer composition can be readily laminated on a desired solid surface such as metal or metal clad substrate. In a photoimaging application such as photoresist formation, selective portions of this solid photocurable polymer composition are photocured and insolubilized, thereby forming a protective coating which shows excellent adhesion to metal surfaces such as copper.

In accordance with this invention, a solid curable polymer composition can be easily prepared from compatible solid polyene and solid polythiol components having a similar polymeric backbone formed from styrene-allyl alcohol copolymers. This styrene-allyl alcohol copolymer based polyene and polythiol mixture is a highly reactive composition which is capable of being photocured when exposed to actinic radiation in the presence of a UV sensitizer to insoluble polythioether containing materials which exhibit excellent physical and chemical properties. For example, photoresist coating formed from the cured styrene-allyl alcohol copolymer based polyene and polythiol composition are capable of withstanding severe chemical environments employed in the printed circuit board manufacturing processes. The subject cured materials resist strongly acid etching solutions or highly alkaline conditions of electroless metal plating baths. The desirable characteristics of the cured materials make the styrene-allyl alcohol copolymer backbone containing polyene-polythiol curable composition particularly useful in both subtractive and additive circuitry applications.

Generally speaking, the novel solid curable composition is comprised of a solid polyene component containing at least 2 reactive carbon to carbon unsaturated bonds per molecule which is a reaction product of a copolymer of styrene-allyl alcohol and at least one unsaturated organic compound such as ene-acid or ene-isocyanate; and a solid polythiol component containing at least two thiol groups, which is the reaction product of a styrene-allyl alcohol copolymer and a mercaptocarboxylic acid.

The formation of such solid polyenes may be schematically represented by the following non-limiting equation, wherein the unsaturated organic compound reactant is an ene-isocyanate having reactive allylic end groups as illustrated by a reaction product of one mole of 2,4-toluene diisocyanate with one mole of allyl alcohol:

I.

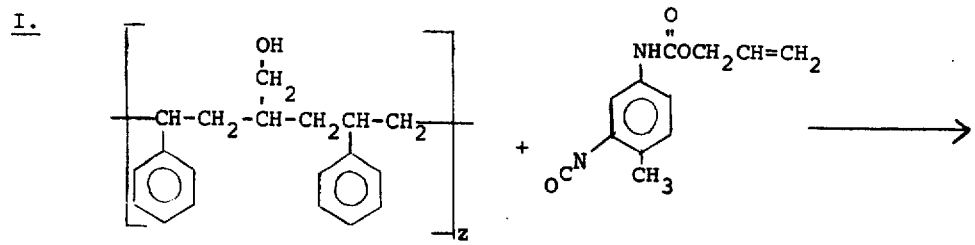

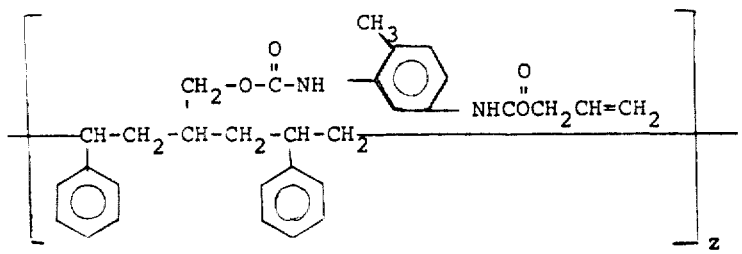

In the above equation, z is at least 2.

Similarly, the formation of the solid polythiol may be represented by the non-limiting equation illustrating β-mercaptopropionic acid as the mercaptocarboxylic reactant:

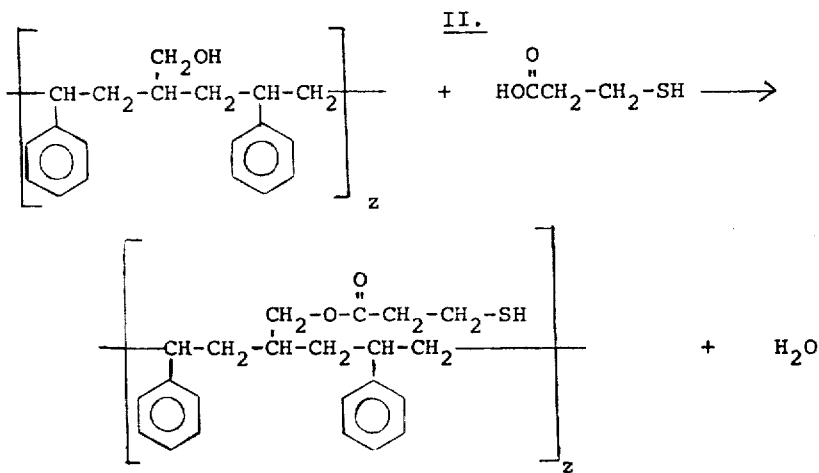

In the above equation, z is at least 2.

It is to be noted that in the above equations I and II, no attempt to show structural arrangement of the polymer is to be inferred.

Broadly, both the operable polyene and polythiol components of the solid curable composition are solid derivatives of styrene-allyl alcohol copolymers in which the reacting group is the hydroxyl functionality of the allyl alcohol portion of the copolymer. Operable solid polyenes include but are not limited to unsaturated ester and urethane derivatives of styrene-allyl alcohol copolymers, while solid polythiols are mercaptoester derivatives of styrene-allyl alcohol copolymers.

As used herein, styrene-allyl alcohol copolymers refer to copolymers of an ethylenically unsaturated alcohol and a styrene monomer. Operable styrene-allyl alcohol copolymers are those containing from about 30 to 94 percent by weight of the styrene monomer, and preferably 60 to 85 percent by weight and correspondingly, from abut 70 to 6 percent by weight of the ethylenically unsaturated alcohol, and preferably from about 40 to 15 percent on the same basis. In general, styrene-allyl alcohol copolymers having from about 1.8 to 10 percent hydroxyl groups by weight, preferably 4 to 8 percent.

The actual hydroxyl group content of the aforesaid copolymers may not always conform to the theoretical content calculated from the relative proportions of styrene monomer and ethylenically unsaturated alcohol, due to possible destruction of hydroxyl groups during copolymerization.

The styrene monomer moiety of said copolymer may be styrene or a ring-substituted styrene in which the substituents are 1-4 carbon atom alkyl groups or chlorine atoms. Examples of such ring-substituted sytrenes include the ortho-, meta- and para-, methyl, ethyl, butyl, etc. monoalkyl styrenes; 2,3- 2,4-dimethyl and diethyl styrenes; mono-, di- and tri-chlorostyrenes; alkylchlorostyrenes such as 2-methyl-4-chlorostyrene, etc. Mixtures of two or more of such styrene monomer moieties may be present. The ethylenically unsaturated alcohol moiety may be allyl alcohol, methallyl alcohol, or a mixture thereof. For the purposes of brevity and simplicity of discussion, the entire class of copolymers set forth in this paragraph shall hereinafter be referred to simply as styrene-allyl alcohol copolymers.

The styrene-allyl alcohol copolymers may be prepared in several ways. One operable method which yields styrene-allyl copolymer starting materials which are solid products is taught in U.S. Pat. No. 2,630,430. A more desirable method of copolymerizing the styrene and allyl alcohol components in a substantially oxygen-free composition, thus minimizing the oxidative loss of hydroxyl groups, is disclosed in U.S. Pat. No. 2,894,938.

Furthermore, the suitable styrene-allyl alcohol copolymers are generally commercially available materials.

The aforedescribed styrene-allyl alcohol copolymers are operable starting materials for the formation of both the solid polyene and solid polythiols.

In the preferred solid curable polyene-polythiol containing compositions, the styrene-allyl alcohol copolymeric backbone is identical for both the polyene and polythiol components, however, components having different styrene-allyl alcohol copolymeric backbones are also operable.

The polyenes of the subject invention have a molecular weight in the range of 332 to 20,000, preferably from 1200 to 10,000.

One group of operable polyenes containing styrene-allyl alcohol copolymer backbones are unsaturated urethane derivatives. These solid polyenes, i.e., unsaturated urethane derivatives of styrene-allyl alcohol copolymers may be represented by the general formula:

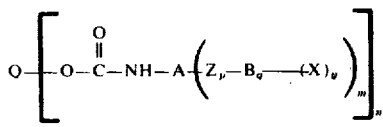

wherein Q is a styrene-allyl alcohol copolymeric moiety remaining after n hydroxyl groups of a said styrene-allyl alcohol co-polymer, have reacted to form $n$ urethane, i.e.,

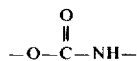

linkages; A and B are polyvalent organic radical members free of reactive carbon to carbon unsaturation and containing group members such as aryl, substituted aryl, aralkyl, substituted aralkyl, cycloalkyl, substituted cycloalkyl, alkyl and substituted alkyl containing 1 to 36 carbon atoms and mixtures thereof. These group members can be internally connected to one another by a chemically compatible linkage such as —O—, —S—, carboxylate, carbonate, carbonyl, urethane and substituted urethane, urea and substituted urea, amide and substituted amide, amine and substituted amine and hydrocarbon. Z is a divalent chemically compatible linkage such as

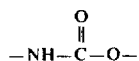

—O— and —S—, preferably

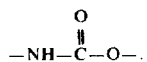

Preferred examples of operable aryl members are either phenyl or naphthyl, and of operable cycloalkyl members which have from 3 to 8 carbon atoms. Likewise, preferred substituents on the substituted members may be such groups as chloro, bromo, nitro, acetoxy, acetamido, phenyl, benzyl, alkyl and alkoxy of 1 to 9 carbon atoms, and cycloalkyl of 3 to 8 carbon atoms.

X is a member selected from the group consisting of:

a. $-(CH_2)_d-(CR'=CHR$
b. $-O(CH_2)_d-CR'=CHR$
c. $-S-(CH_2)_d-CR'=CHR$
d. $-(CH_2)_d-C \equiv CR$
e. $-O-(CH_2)_d-C \equiv CR$
f. $-S-(CH_2)_d-C \equiv CR$ and mixtures thereof; and R and R' each are independently either a hydrogen or methyl radical, preferably a hydrogen radical; and $d$, $p$ and $q$ each are integers from 0 to 1; $y$ is an integer from 1 to 10, preferably 1 to 5; $m$ is an integer of at least 1, preferably from 1 to 4, and more particularly from 1 to 2, and $n$ is an integer of at least 1, and preferably 2 or greater, and more particularly from about 4 to 10, with the proviso that when $n$ is $l$, $y$ or $m$ is at least 2.

As used herein, polyenes and polyynes refer to simple or complex species of alkenes or alkynes having a multiplicity of pendant or terminally reactive carbon to carbon unsaturated functional groups per average molecule. For example, a diene is a polyene that has two reactive carbon to carbon double bonds per average molecule, while a diyne is a polyyne that contains two reactive carbon to carbon triple bonds per average molecule; a solid polyene which is a reaction product of a styrene-allyl alcohol copolymer having about 8 hydroxyl groups per average molecule and a reactive unsaturated monoisocyanate having one terminal reactive carbon to carbon double bond per average molecule is a complex polyene which contains in its structure 8 reactive carbon to carbon double bonds per average molecule. For purposes of brevity, all these classes of compounds will be referred to hereafter as polyenes.

In defining the position of the reactive functional carbon to carbon unsaturation, the term terminal is intended to mean that functional unsaturation is at an end of the main chain in the molecule. The term pendant means that the reactive carbon to carbon unsaturation is located terminal in a branch of the main chain as contrasted to a position at or near the ends of the main chain. For purposes of brevity, all of these positions are referred to herein generally as terminal unsaturation.

Functionality as used herein refers to the average number of ene or thiol groups per molecule in the polyene or polythiol, respectively. For example, a triene is a polyene with an average of three reactive carbon to carbon unsaturated groups per molecule, and thus has a functionality $(f)$ of three. A dithiol is a polythiol with an average of two thiol groups per molecule and thus has a functionality $(f)$ of two.

The term reactive unsaturated carbon to carbon groups means groups which will react under proper conditions as set forth herein with thiol groups to yield the thioether linkage

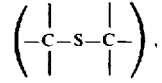

as contrasted to the term unreactive carbon to carbon unsaturation which means

groups found in aromatic nuclei (cyclic structures exemplified by benzene, pyridine, anthracene, and the like) which do not under the same conditions react with thiols to give thioether linkages. For purposes of brevity, this term will hereinafter be referred to generally as reactive unsaturation or a reactive unsaturated compound.

As used herein, the term polyvalent means having a valence of two or greater.

A general method of forming the urethane containing styrene-allyl alcohol copolymer based polyene is to react the styrene-allyl alcohol represented by a general formula Q—(OH)$_n$, which $n$ is at least 1 and Q is as hereinbefore set forth; with at least one reactive unsaturated isocyanate of the general formula NCO—A$\frac{}{q}$Z-$_p$—B$_q$—(X)$_y$]$_m$ in which the members A, Z, B, X and the integers $p$, $q$, $y$ and $m$ are as hereinbefore set forth.

The term reactive unsaturated isocyanate will hereinafter be referred to as an ene-isocyanate or an yne-isocyanate.

The reaction is carried out in a moisture free atmosphere at atmospheric pressure at a temperature in the range from about 30° to 100°C, preferably from about 40° to 80°C, for a period of about 10 minutes to about 24 hours. The reaction is preferably a one step reaction wherein all the reactants are charged together. The ene-isocyanate or yne-isocyanate is added in a stoichiometric amount necessary to react with the hydroxy groups in the sytrene-allyl alcohol copolymer. The reaction, if desired, may be carried out in the presence of a catalyst and inert solvent. Operable non-limiting catalysts include tin catalysts such as dibutyl tin dilaurate, stannous octoate; tertiary amines such as triethylene diamine or N,N,N',N'-tetramethyl-1,3-butanediamine, etc. Useful inert solvents include aromatic hydrocarbons, halogenated saturated aliphatic or aromatic hydrocarbons and mixtures thereof. Representative non-limiting examples include benzene, chlorobenzene, chlorofrom, 1,1,1-trichloroethane, 1,2-dichloroethane and the like.

Operable ene- or yne- isoyanates having the above defined general formula include, but are not limited to, simple monoeneisocyanates such as allyl isocyanate, 2-methallyl isocyanate, crotyl isocyanate, etc.

The aforementioned reactive unsaturated isocyanates are a group of compounds having the above general formula of operable ene- or yne-isocyanates wherein the integers $p$ and $q$ are 0 and $m$ is 1. Thus, the urethane styrene-allyl alcohol copolymer based polyenes formed for these reactive unsaturated isocyanates may be represented by simplifying the general formula for the polyenes to the following specific formula:

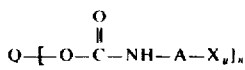

wherein preferably $y$ is 1 and $n$ is 2 and the other members being as hereinbefore set forth.

Other operable ene- or yne-isocyanates are those prepared by reacting a polyisocyanate of the general formula A—(NCO)$_x$, in which $x$ is at least 2 and A is as hereinbefore set forth; with a reactive unsaturated alcohol of the general formula [(X)$_y$—B]—OH in which B, X and $y$ are as hereinbefore set forth.

The above polyisocyanate and alcohol reactants are added in such stoichiometric amounts that $x-1$ isocyanate groups react to give $x-1$ urethane linkages.

Operable non-limiting examples of starting polyisocyanate reactants include hexamethylenediisocyanate, tolylene diisocyanate, xylylene diisocyanate, methylenebis(phenyl isocyanate), 4,4'-methylene(cyclohexyl isocyanate), 1-methoxy-2,4,6-benzenetrisocyanate, 2,4,4'-triisocyanatodiphenylether, diphenylmethane tetraisocyanates, polyisocyanates having various functional groups such as N,N',N''-tris-(isocyanatohexyl)-biuret or adducts of polyalcohols and diisocyanates which have at least 2 free isocyanate groups. Adducts of trimethylolpropane and 3 moles of toluene diisocyanate, is suitable.

Illustrative of the operable reactive unsaturated alcohols which may react with the polyisocyanates to give the desired eneisocyanate include but are not limited to allyl and methallyl alcohol, crotyl alcohol, ω-undecylenyl alcohol, 2-vinyloxyethanol, vinylhydroxyethyl sulfide, propargyl alcohol, 1-allylcyclopentanol, 2-methyl-3-butene-2-ol. Reactive unsaturated derivatives of polyhydric alcohols such as glycols, triols, tetraols, etc., are also suitable. Representative examples include trimethylolpropane or trimethylolethane diallyl ethers, pentaerythritol triallyl ether and the like. Mixtures of various reactive unsaturated alcohols are operable as well. A suitable ene-isocyanate prepared by treating one mole of trimethylbenzene triisocyanate with two moles of trimethylolpropane diallyl ether. The resulting urethane containing ene-isocyanate is a polyene having four reactive allyl ether groups per molecule. Mixtures of various ene- or yne-isocyanates are operable as well.

Another class of solid polyenes operable in forming the solid curable polyene-polythiol system of the subject invention are esters of styrene-allyl alcohol copolymers. Similarly, these polyenes may be represented by the general formula

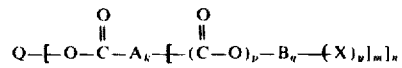

wherein Q is a styrene-allyl alcohol copolymeric moiety remaining after removal of n hydroxyl groups from a said styrene-allyl alcohol copolymer thereby forming an ester linkage; the members A, B, and X and integers $p$, $q$, $y$, $n$ and $m$ are as hereinbefore set forth in the urethane containing styrene allyl-alcohol copolymer based polyene and $k$ is an integer from 0 to 1.

A general method of forming these esters is to react the styrene-allyl alcohol copolymer represented by the aforedefined general formula Q—(OH)$_n$; with at least one reactive unsaturated monocarboxylic acid of the general formula:

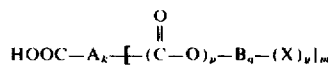

in which the members A, B and X, and the integers $k$, $p$, $q$, $y$ and $n$ are as hereinbefore set forth. The term reactive unsaturated carboxylic acid will hereinafter be referred to as an ene- and/or an yne-acid.

The esterification reaction may be carried out in a conventional manner in the presence of an acid catalyst, the water formed during the reaction being removed as an azeotrope.

Operable ene- or yne-acids include but are not limited to simple monoene-acids such as acrylic acid, methacrylic acid, vinylacetic acid, 5-hexenoic acid, 6-heptynoic acid, propiolic acid and the like.

These aforementioned reactive unsaturated acids are a group of acids having the above general formula of operable ene- or yne-acids wherein the integers $p$ and $q$ are 0, and $m$ is 1. Thus the ester containing styrene-allyl alcohol copolymer based polyenes formed from these reactive unsaturated acids may be represented by simplifying the general formula for the polyenes to the following specific formula:

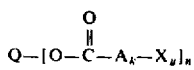

wherein, preferably, $y$ is 1 and $n$ is 2 and the other members being as hereinbefore set forth.

Other operable acids are those containing more than one terminally reactive unsaturated group in the molecule. These may be prepared by reacting a polycarboxylic acid of the general formula $A—(COOH)_x$, in which $x$ is at least 2 and A is as herein-before set forth, with a reactive unsaturated alcohol of the general formula $[(X)_y—B]—OH$, in which B, X and y are as hereinbefore set forth.

The above polycarboxylic acid and alcohol reactants are added in such stoichiometric amounts that $x$-1 carboxylic groups react to give $x$-1 ester linkages.

Operable polycarboxylic acids include but are not limited to dicarboxylic acids such as adipic, tartaric, succinic, terephthalic, etc.

Operable reactive unsaturated alcohol components are the same as described above as being suitable in forming ene-isocyanates. As an example, a suitable ene-acid can be prepared by reacting one mole of trimethylolpropane diallyl ether with one mole of succinic anhydride in the presence of pyridine as a solvent. The resulting succinate product contains a free carboxylic group as well as two reactive allyl ether groups.

The polythiol component of the solid curable composition is solid mercaptoester having at least two thiol groups per molecule. The polythiol is a reaction product of a styrene-allyl alcohol copolymer and at least one mercaptocarboxylic acid. The polythiols have a molecular weight in the range from about 472 to 20,000, preferably 1300 to 8000, and may be represented by the following general formula:

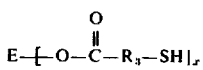

wherein $x$ is an integer of at least 2, and preferably from 4 to 10, and E is a styrene-allyl alcohol copolymeric moiety remaining after removal of n hydroxyl groups from a said styrene-allyl alcohol copolymer, thereby forming x ester linkages; $R_3$ is a polyvalent organic radical member free of reactive carbon to carbon unsaturation and contains group members such as aryl, substituted aryl, aralkyl, substituted aralkyl, cycloalkyl, substituted cycloalkyl, alkyl and substituted alkyl groups containing 1 to 16 carbon atoms.

Preferred examples of operable aryl members are either phenyl or naphthyl, and of operable cycloalkyl members which have from 3 to 8 carbon atoms. Likewise, preferred substitutents on the substituted members may be such groups as chloro, bromo, nitro, acetoxy, acetamido, phenyl, benzyl, alkyl and alkoxy of 1 to 9 carbon atoms, and cycloalkyl of 3 to 8 carbon atoms.

Operable styrene-allyl alcohol copolymers are those which have been described in detail above.

Operable mercaptocarboxylic acids include but are not limited to thioglycollic acid (mercaptoacetic acid), α-mercaptopropionic acid, β-mercaptopropionic acid, 4-mercaptobutyric acid, mercaptovaleric acids, mercaptoundecyclic acid, mercaptostearic acid, and o- and p-mercaptobenzoic acids. Preferably, thioglycollic or β-mercaptopropionic acid is employed. Mixtures of various mercaptocarboxylic acids are operable as well.

The polythiol esters are prepared by the esterification of the styrene-allyl alcohol with mercaptocarboxylic acid in the presence of an acid catalyst, the water formed during the reaction being removed as an azeotrope in a suitable solvent.

The reaction is carried out in an inert, moisture-free atmosphere at atmospheric pressure at a temperature in the range of from 60° to about 150°C, preferably from 60° to 110°C for a period of 30 minutes to about 24 hours.

Suitable acid catalysts include but are not limited to p-toluenesulfonic acid, sulfuric acid, hydrochloric acid and the like. Useful inert solvents include but are not limited to saturated aliphatic hydrocarbons, aromatic hydrocarbons, chlorinated hydrocarbons, ethers, ketones, etc. Representative non-limiting examples of solvents include toluene, benzene, xylene, chloroform, 1,2-dichloroethane, etc.

In summary, by admixing the novel solid styrene-allyl alcohol copolymer based polyenes and polythiols and thereafter exposing the solid mixture at ambient conditions to a free radical generator, a solid, cured insoluble polythioether product is obtained.

Prior to curing the solid polyene and polythiol, components are admixed in a suitable manner so as to form a homogeneous solid curable mixture. Thus, the polyene and polythiol reactants may be dissolved in a suitable solvent and thereafter the solvent can be removed by suitable means such as evaporation.

To obtain the maximum strength, solvent resistance, creep resistance, heat resistance and freedom from tackiness, the reactive components consisting of the polyenes and polythiols are formulated in such a manner as to give solid, crosslinked, three dimensional network polythioether polymer systems on curing. In order to achieve such infinite network formation, the individual polyenes and polythiols must each have a functionality of at least 2 and the sum of the functionalities of the polyene and polythiol components must always be greater than 4. Blends and mixtures of various solid polyenes and various solid polythiols containing said functionality are also operable herein.

The solid compositions to be cured in accord with the present invention may, if desired, include such additives as antioxidants, accelerators, dyes, inhibitors, activators, fillers, thickeners, pigments, anti-static agents, flame-retardant agents, surface-active agents, extending oils, plasticizers and the like within the scope of this invention. Such additives are usually preblended with the polyene or polythiol prior to or during the compounding step. The aforesaid additives may be present in quantities up to 500 or more parts based on 100 parts by weight of the polyene-polythiol curable compositions and preferably 0.005–300 parts on the same basis.

The solid polythioether-forming components and compositions, prior to curing may be admixed with or blended with other monomeric and polymeric materials such as thermoplastic resins, elastomers or thermosetting resin monomeric or polymeric compositions. The resulting blend may be subjected to conditions for curing or co-curing of the various components of the blend to give cured products having unusual physical properties.

Although the mechanism of the curing reaction is not completely understood, it appears most likely that the curing reaction may be initiated by most any free radical generating source which dissociates or abstracts a hydrogen atom from an SH group, or accomplishes the equivalent thereof. Generally, the rate of the curing reaction may be increased by increasing the temperature of the composition at the time of initiation of cure. In many applications, however, the curing is accomplished conveniently and economically by operating at ordinary room temperature conditions.

Operable curing initiators or accelerators include radiation such as actinic radiation, e.g., ultraviolet light, lasers; ionizing radiation such as gamma radiation, X-rays, corona discharge, etc.; as well as chemical free radical generating compounds such as azo, peroxidic, etc., compounds.

Azo or peroxidic compounds (with or without amine accelerators) which decompose at ambient conditions are operable as free radical generating agents capable of accelerating the curing reaction include benzoyl peroxide, di-t-butyl peroxide, cyclohexanone peroxide with dimethyl aniline or cobalt naphthenate as an accelerator; hydroperoxides such as hydrogen peroxide, cumene hydroperoxide, t-butyl hydroperoxides; peracid compounds such as t-butylperbenzoate, peracetic acid; persulfates, e.g., ammonium persulfate; azo compounds such as azobis-isobutyronitrile and the like.

These free radical generating agents are usually added in amounts ranging from about 0.001 to 10 percent by weight of the curable solid polyene-polythiol composition, preferably 0.01 to 5 percent.

The curing period may be retarded or accelerated from less than 1 minute to 30 days or more.

Conventional curing inhibitors or retarders which may be used in order to stabilize the components or curable compositions so as to prevent premature onset of curing may include hydroquinone; p-tert-butyl catechol; 2,6-di tert-butyl-p-methylphenol; phenothiazine; N-phenyl-2-naphthylamine; phosphorous acid; pyrogallol and the like.

The preferred free radical generator for the curing reaction is actinic radiation, suitably in the wavelength of about 2000 to 7500A, preferably for 2000 to 4000A.

A class of actinic light useful herein is ultraviolet light, and other forms of actinic radiation which are normally found in radiation emitted from the sun or from artificial sources such as Type RS Sunlamps, carbon arc lamps, xenon arc lamps, mercury vapor lamps, tungsten halide lamps and the like. Ultraviolet radiation may be used most efficiently if the photocurable polyene/polythiol composition contains a suitable photocuring rate accelerator. Curing periods may be adjusted to be very short and hence commercially economical by proper choice of ultraviolet source, photocuring rate accelerator and concentration thereof, temperature and molecular weight, and reactive group functionality of the polyene and polythiol. Curing periods of less than about 1 second duration are possible, especially in thin film applications such as desired, for example, in coatings, adhesives and photoimaged surfaces.

Various photosensitizers, i.e., photocuring rate accelerators are operable and well known to those skilled in the art. Examples of photosensitizers include, but are not limited to, benzophenone o-methoxybenzophenone, acetophenone, o-methoxyacetophenone, acenaphthene-quinone, methyl ethyl ketone, valerophenone, hexanophenone, γ-phenylbutyrophenone, p-morpholinopropiophenone, dibenzosuberone, 4-morpholinobenzophenone, benzoin, benzoin methyl ether, 4'-morpholinodeoxybenzoin, p-diacetylbenzene, 4-aminobenzophenone, 4'-methoxyacetophenone, benzaldehyde, o-methoxybenzaldehyde, α-tetralone, 9-acetylphenanthrene, 2-acetylphenanthrene, 10-thioxanthenone, 3-acetylphenanthrene, 3-acetylindole, 9-fluorenone, 1-indanone, 1,3,5-triacetylbenzene, thioxanthen-9-one, xanthene-9-one, 7-H-benz[de]anthracen-7-one, 1-naphthaldehyde, 4,4'-bis(dimethylamino)-benzophenone, fluorene-9-one, 1'-acetonaphthone, 2'-acetonaphthone, triphenylphosphine, tri-o-tolylphosphine, acetonaphthone and 2,3-butanedione, benz[a]anthracene 7,12 dione, etc., which serve to give greatly reduced exposure times and thereby when used in conjunction with various forms of energetic radiation yield very rapid, commercially practical time cycles by the practice of the instant invention.

These photocuring rate accelerators may range from about 0.005 to 50 percent by weight of the solid photocurable polyenepolythiol composition, preferably 0.05 to 25 percent.

The mole ratio of the ene/thiol groups for preparing the solid curable composition is from about 0.2/1.0 to about 8/1.0, and preferably from 0.5/1.0 to about 2/1.0 group ratio.

The solid curable styrene-allyl alcohol copolymer based polyene and polythiol compositions are used in preparing solid, cured crosslinked insoluble polythioether polymeric products having many and varied uses, examples of which include, but are not limited to, coatings; adhesives; films; molded articles; imaged surfaces, e.g., solid photoresists; solid printing plates; e.g., offset, lithographic, letterpress, gravures, etc., silverless photographic materials and the like.

Since the cured materials formed from the solid polyenesolid polythiol composition posses various desirable properties such as resistance to severe chemical and physical environments, they are particularly useful for preparing imaged surfaces.

A general method for preparing coatings, particularly imaged surfaces such as photoresists, printing plates, etc., comprises coating the solid curable composition on a solid surface of a substrate such as plastic, rubber, glass, ceramic, metal, paper and the like; exposing image-wise either directly using "point" radiation or through an image bearing transparency, e.g., photographic negative or positive or a mask, e.g., stencil, to radiation, e.g., U.V. light until the curable composition cures and cross-links in the exposed areas. After imagewise exposure, the uncured, unexposed areas are removed, e.g., with an appropriate solvent, thereby baring the unprotected surface of the substrate in selected areas. The resulting products are cured latent images on suitable substrates or supports. In case or preparing printing plates, e.g., a flexible relief plate wherein the substrate is usually a plastic material, the imaged product is ready for use. However, in other cases, e.g., in printed circuit manufacture or in chemical milling, the cured polymer composition acts as a photoresist.

The solid curable polyene-polythiol compositions of the subject invention are extremely suitable for use as a photoresist composition since (1) it adheres to the substrate firmly and readily on photocuring, (2) is resistant to the etching and plating environments for the substrate as well as soldering environments and (3) is easily removed by a solvent which does not affect the protected area.

Thus, in the preparation of an imaged surface by one operable photoresist process, the solid photocurable polyene-polythiol composition is coated or laminated onto an etchable solid surface, preferably a metal or metal clad substrate, as a solid, tack-free layer; exposed through an image bearing transparency to a free radical generator such as actinic radiation suitably in the wavelength range from about 2000 to 7500A or ionizing radiation to selectively cure the exposed portion of the composition, thus baring the metal beneath the removed uncured portion of the composition, optionally removing the exposed metal from the substrate to the desired depth and thereafter optionally removing the cured composition, thus leaving defined metal areas on the substrate.

In the printed circuit board manufacturing processes, the solid surface or board is usually electrically insulating substrate such as ceramic, thick plastic, epoxy, glass, etc., which can be clad with an etchable metal such as copper, aluminum, nickel, stainless steel and the like.

The above process illustrates the use of the solid photoresist in substractive circuitry applications, however, the subject solid photoresist compositions are very satisfactory for use in additive circuitry applications which utilize electroless metal plating processes which generally have highly caustic plating baths and thus require an extremely resistant photoresist material. Typical electroless metal plating baths, as well as conventional sensitizing and activating solutions utilized in additive circuit processes are disclosed in U.S. Pat. Nos. 3,546,009 and 3,573,973.

Various metals such as copper, nickel, gold, silver, tin, lead, etc., may be plated on metal clad substrates by conventional metal depositing techniques other than electroless plating, such as electroplating, chemical vapor deposition, flow soldering coating techniques and the like. The subject photocured resist composition are capable of withstanding the various metal depositing environments.

The solid film of photocurable composition can be formed by coating a solution or dispersion onto the metal cladding of a substrate and drying the layer by removal of the solvent by any suitable means, such as evaporation. The solid photoresist compositions may also be melted and suitably applied directly onto the metal surface of a metal clad substrate. Coating may be carried out by any of the conventional coating procedures such as spraying, dip coating, roller coating or curtain coating.

The photocurable resist layer has usually a dry coating thickness of about 1 mil, although it may range from 0.015 to about 5 mils or more.

In forming the solid photoresist composition comprised of the solid polythiol and the solid polyene, it is desirable that the photocurable composition contain a photocuring rate accelerator from about 0.005 to 50 parts by weight based on 100 parts by weight of the aforementioned polyene and polythiol.

It is to be understood, however, that when energy sources, e.g., ionizing radiation, other than visible or ultraviolet light, are used to initiate the curing reaction, photocuring rate accelerators (i.e., photosensitizers, etc.) generally are not required in the formulation.

When U.V. radiation is used for the curing reaction, a dose of 0.0004 to 6.0 watts/cm$^2$ is usually employed.

The thickness of the metal or metal cladding on the substrates may vary from 0.1 mil to 20 mils, depending on the desired end use.

The following examples will aid in explaining, but should not be deemed limiting, the instant invention. In all cases unless otherwise noted, all parts and percentages are by weight.

PREPARATION OF SOLID POLYENES

Example 1

In a 1-liter flask maintained under a nitrogen atmosphere and equipped with a stirrer, thermometer, condenser and a gas inlet and outlet, was added 348 g (2.0 moles) of toluene diisocyanate (a 80/20 mixture of the 2,4 and 2,6 isomers). 116 g (2.0 moles) of allyl alcohol was slowly added over a period of 2 hours to the reaction vessel with stirring during which time the exotherm and reaction temperature were maintained below about 70°C. After the addition of the allyl alcohol was completed the reaction was continued for about 15 hours at about 25°C. The thus formed liquid monoallyl urethane had an NCO content of 4.13 meq/g and an unsaturation of 4.5 mmoles/g. This product will hereinafter be referred to as ene-isocyanate A.

Example 2

110 g of a copolymer of styrene allyl alcohol having an equivalent weight of about 220 and a hydroxyl content of about 7.7 percent and commercially available from Monsanto Company under the tradename RJ 101, was dissolved in 300 ml of benzene in a 1-liter reaction flask maintained under a nitrogen atmosphere and equipped with a stirrer, condenser, thermometer and a gas inlet and outlet. 0.6 g of dibutyl tin dilaurate as a catalyst was added to the reaction flask followed by dropwise addition over a period of 1/2 hour of 116 g of the ene-isocyanate A prepared in Example 1. The reaction was allowed to continue for about 15 hours while maintaining the temperature at about 70°C. Thereafter, the reaction mixture was cooled to room temperature and the solvent was removed under vacuum. The resulting solid polyene having a styrene-allyl alcohol based polymeric backbone (190 g) had an unsaturation of 2.2 mmoles/g and a melting point of 85°–105°C. This polyene will hereinafter be referred to as Polyene A.

Example 3

Example 2 was repeated except that 150 g of a copolymer of styrene-allyl alcohol having an equivalent weight of about 300 and a hydroxyl content of about 5.7 percent and commercially available from Monsanto Company under the tradename RJ 100, instead of the RJ 101 was employed as the styrene-allyl alcohol copolymer backbone and the benzene solvent was replaced by 1,2-dichloroethane. The resulting solid was an allyl terminated polyene having a styrene-allyl alcohol copolymer based polymeric backbone. This polyene will hereinafter be referred to as Polyene B.

Example 4

220 g of a copolymer of styrene allyl-alcohol having an equivalent weight of about 220 and a hydroxyl content of about 7.7 percent and commercially available from Monsanto Company under the tradename RJ 101, and 72.0 g acrylic acid along with 400 ml of benzene as solvent and 1.5 g of p-toluenesulfonic acid as a catalyst were charged to a resin kettle equipped with a stirrer, condenser, Dean Stark trap, thermometer and gas inlet and outlet. The mixture was heated to reflux and the benzene-water azeotrope was collected. The amount of water obtained was about 16.0 ml. The reaction mixture was then diluted with 400 ml benzene and washed two times with 250 ml portions of 10 percent sodium bicarbonate solution to remove the excess unreacted acid. The thus treated mixture was then vacuum-stripped to remove the benzene. The mixture was then dried in a vacuum oven at 40°C resulting in a solid polyene containing acrylic acid ester groups and styrene-allyl alcohol copolymer based polymeric backbone. This solid polyene had an unsaturation of 2.5 mmoles/g and a melting point from about 83°–75°C. This polyene will hereinafter be referred to as Polyene C.

PREPARATION OF SOLID POLYTHIOLS

Example 5

220 g of a copolymer of styrene allyl-alcohol having an equivalent weight of about 220 and a hydroxyl content of about 7.7 percent and commercially available from Monsanto Company under the tradename RJ 101, and 106 g of $\beta$-mercaptopropionic acid along with 400 ml of benzene as a solvent and 2.0 g of p-toluenesulfonic acid as a catalyst were charged to a resin kettle equipped with a stirrer, condenser, Dean Stark trap, thermometer and gas inlet and outlet. The mixture was heated to reflux and the benzene-water azeotrope was collected. The amount of water obtained was about 18 ml. The reaction mixture was then vacuum-stripped to remove the benzene. The mixture was then dried in a vacuum oven at 40°C resulting in a white rubbery solid polythiol having a styrene-allyl alcohol copolymer bases polymeric backbone which had a mercaptan content of 2.65 meq/g. This polythiol will hereinafter be referred to as Polythiol A.

Example 6

Example 3 was repeated except that 2.0 of sulfuric acid instead of p-toluenesulfonic acid was employed as a catalyst. The results were substantially the same as in Example 3.

Example 7

Example 5 was repeated except that 300 g of a copolymer of styrene-allyl alcohol having an equivalent weight of about 300 and a hydroxyl content of about 5.7 percent and commercially available from Monsanto Company under the tradename RJ 100, instead of the RJ 101 was employed as the styrene-allyl alcohol copolymeric backbone. The resulting rubbery solid polythiol had a mercaptan content of about 2.38 meq/g and will hereinafter be referred to as Polythiol B.

Example 8

110 g of a copolymer of styrene allyl-alcohol having an equivalent weight of about 220 and a hydroxyl content of about 7.7 percent and commercially available from Monsanto Company under the tradename RJ 101, and 46 g of mercaptoacetic acid along with 250 ml of benzene as solvent and 1.0 g of p-toluenesulfonic acid as a catalyst were charged to a resin kettle equipped with a stirrer, condenser, Dean-Stark trap, thermometer and gas inlet and outlet. The mixture was heated to reflux and the benzene-water azeotrope was collected. The amount of water obtained was about 11 ml. The reaction mixture was then vacuum-stripped to remove most of the benzene. The mixture was poured into petroleum ether in a blender to precipitate a solid which was dried in a vacuum oven at 40°C resulting in a rubbery, non-tacky solid polythiol ester having a styrene-allyl alcohol based polymeric backbone. This polythiol which had a mercaptan content of 2.94 meq/g will hereinafter be referred to as Polythiol C.

CURING PROCESSES

EXAMPLE 9

An admixture of 3.7 g of solid Polyene A from Example 2, 4.5 g of solid Polythiol A from Example 5 and 0.2 g benzophenone were dissolved in acetone. The solution was applied uniformly to the copper surface of a circuit board comprising a 0.001 inch thick copper cladding on a 0.050 inch epoxy-glass substrate.

The acetone was allowed to evaporate, leaving about a 1 mil solid photocurable coating of the admixture on the copper. A negative image-bearing transparency of a printed circuit was placed in contact with and over the coating, and the photocurable coating was exposed through the transparency to UV radiation from a 8,000 watt Ascorlux pulsed xenon arc lamp at a surface intensity of 3800 microwatts/cm$^2$ for about 100 seconds. The major spectral lines of this lamp are all above 3000 A. The negative transparency was removed and the coating was washed in acetone to remove the unexposed, uncured portion thereof, thus exposing the copper thereunder. The imaged circuit board was then etched in an aqueous 30 percent by weight ammonium persulfate solution for about 5 minutes at 120°F to remove the exposed copper, followed by a water wash. The cured photoresist coating was then removed in methylene chloride solution, thus revealing the desired copper electrical circuit.

Example 10

An admixture of 2.0 g of Polyene A from Example 2, 3.0 g of solid Polythiol A from Example 5, 0.025 g of octadecyl-$\beta$-(4-hydroxy-3,5-di-t-butyl phenyl) propionate, a stabilizer commercially available from Geigy-Ciba under the tradename "Irganox 1076," 0.025 g of 2,6-di-tert-butyl-4-methyl phenol commercially available under the tradename "Ionol" from Shell Chemical Co. and 0.2 g benzophenone were dissolved in chloroform. The solution was applied uniformly to a 1 mil thick protective polyethylene terephthalate film. The chloroform was allowed to evaporate leaving a 1.5 mil solid photocurable coating of the admixture on the film. The coating on the polyethylene terephthalate film was brought in contact with the copper cladding of a clean copper clad epoxy-glass printed circuit board blank. Heat (60°C) and pressure are applied to make the laminate. The polyethylene terephthalate film was stripped off. A negative image-bearing transparency of a printed circuit was placed in contact with and over the coating, and the photocurable coating was exposed through the transparency to UV radiation from a 8000 watt Ascorlux pulsed xenon arc lamp at a surface intensity of 3800 microwatts/cm$^2$ for 1 minute. The major spectral lines of this lamp are all above 3000 A. The negative transparency was removed and the coating was washed in 1,1,1-trichloroethane to remove the unexposed, uncured portion thereof, thus exposing the copper thereunder.

The imaged coated circuit board was then etched in a 50 percent by volume nitric acid solution for more than 5 minutes at 25°C to remove the exposed copper, followed by a water wash. The cured photoresist coating which was not affected by the strong acid solution was then removed by a methylene chloride solvent, thus revealing the desired copper electrical circuit on the epoxy-glass printed circuit board.

Example 11

Example 10 was repeated except the printed circuit board blank had a cladding of nickel metal instead of copper, and the cured photoresist was removed with trichlorethylene instead of methylene chloride. The procedure resulted in a highly satisfactory quality nickel electrical circuit board.

Example 12

A mixture containing 2.0 g of solid Polyene A from Example 2, 3.0 g of solid Polythiol A from Example 5, 0.2 g of benzophenone, 0.025 g of octadecyl β-(4-hydroxy-3,5-di-t-butyl phenyl)propionate commercially available from Geigy-Ciba under the tradename "Irganox 1076" and 0.025 g of 2,6-di-tert-butyl-4-methylphenol, an antioxidant commercially available under the tradename "Ionol" from Shell Chemical Co. was dissolved in chloroform. The solution was applied uniformly to a 1 mil thick protective polyethylene terephthalate film. The chloroform was allowed to evaporate leaving a 1.5 mil solid photocurable coating of the admixture on the film. A second protective 1 mil thick polyethylene film was laminated to the coating under pressure at 25°C to form a sandwich. The polyethylene film was stripped off and the coating on the polyethylene terephthalate film was brought in contact with the surface of a epoxy-glass printed circuit board blank which had been treated with a conventional cleaning and sensitizing solution which rendered the surface receptive to electroless copper deposition. Heat ( 60°C) and pressure are applied to make the laminate which showed good adhesion to the treated epoxy-glass surface. The polyethylene terephthalate film was stripped off. A negative image-bearing trnasparency of a printed circuit was placed in contact with and over the coating, and the photocurable coating was exposed through the transparency to UV radiation from a 8000 watt Ascorlux pulsed xenon acr lamp at a surface intensity of 3800 microwatts/cm$^2$ for 1 minute. The major spectral lines of this lamp are all above 3000 A. The negative transparency was removed and the coating was washed in 1,1,1-trichloroethane to remove the unexposed, uncured portion thereof, thus exposing the sensitized epoxy-glass surface of the printed circuit board. The thus treated photocured resist coated substrates was placed into a conventional solution containing a catalyst for accelerating the deposition of copper prior to immersion into an electroless plating bath for about 2 minutes. The thus catalyzed solid photocured resist coated substrate was then placed into a highly alkaline (pH about 12) electroless copper plating bath at about 60°C. and after about 5 minutes a bright shiny layer of copper wad deposited on the exposed areas of the epoxy-glass substrate. This copper coated board was allowed to remain an additional 5 hours in the electroless copper plating bath. The resulting product was a cured photoresist bearing printed circuit board having a uniform layer of copper deposited on the catalyzed epoxyglass areas of the board unprotected by the photocured resist layer. Inspection of the board showed that the photocured resist layer exhibited excellent resistance to the highly alkaline plating environment.

Example 13

Example 12 was repeated except that a commercially available photopolymer solid film resist composed of a photopolymerizable polymer was employed as the photoresist material instead of the solid photocurable composition of Example 10. Within 2 hours of being exposed to the alkaline electroless copper plating bath, the photopolymerized hardened photoresist layer exhibited blistering.

Example 14

An admixture of 2.0 g of solid Polyene A from Example 2, 3.10 g parts of solid Polythiol A from Example 5, 0.2 g of benzophenone, 0.025 g of "Irganox 1075," 0.025 g "Ionol", 0.025 g phosphorous acid was dissolved in chloroform. The solution was applied uniformly by means of a drawbar to the copper surface of a copper clad epoxy-glass printed circuit board blank.

The chloroform was allowed to evaporate, leaving a 1 mil solid photocurable coating of the admixture on the copper. A negative image-bearing transparency of a printed circuit was placed in contace with and over the coating, and the photocurable coating was exposed through the transparency to UV radiation from a 8000 watt Ascorlux pulsed xenon arc lamp at a surface intensity of 3000 microwatts/cm$^2$ for two minutes. The major spectral lines of this lamp are all above 3000 A. The negative transparency was removed and the coating was washed in 1,1,1-trichloroethane to remove the unexposed, uncured portion thereof, thus exposing the copper thereunder.

The imaged circuit board was passed over a foaming flux, i.e. "Hydrosolv 709" a fast drying organic flux commercially available from Alphametal Inc. to coat with the flux the unprotected copper surface to be soldered. The board was then conveyed over a preheater maintained at a temperature of 700°F and then over a solder bath containing 60/40 tin-lead alloy and maintained at 500°F. A uniform layer of tin-lead alloy was deposited on the copper areas unprotected by the photocured resist layer. Inspection of the board showed that the cured composition was unaffected by the soldering steps.

Example 15

An admixture of 4.7 g of solid Polyene B from Example 3, 3.9 g of solid Polythiol B from Example 7, and 0.2 of benzophenone was dissolved in 1,2-dichloroethane. The solution was applied uniformly to the copper surface of a copper clad epoxy-glass printed circuit board blank.

The dichlorethane was allowed to evaporate, leaving a 1 mil solid photocurable coating of the admixture on the copper. A negative image-bearing transparency of a printed circuit was placed in contact with and over the coating, and the photocurable coating was exposed through the transparency to UV radiation from a 8000 watt Ascorlux pulsed xenon arc lamp at a surface intensity of 3800 microwatts/cm$^2$ for about 2 minutes. The major spectral lines of this lamp are all above 3000 A. The negative transparency was removed and the coating was washed in 1,1,1 trichloroethane to remove the unexposed, uncured portion thereof, thus exposing the copper thereunder. The image circuit board was then etched in an aqueous 30 percent by weight ammonium persulfate solution for about 5 minutes at 120°F to remove the exposed copper, followed by a water wash. The cured photoresist coating which was not affected by the etching solution was left on the etched printed circuit board as a protective cover for the desired copper electrical circuit thereunder.

Example 16

An admixture of 2.7 g of solid Polyene C from Example 4, 3.3 g of solid Polythiol A from Example 5, and 0.1 g of dibenzosuberone were dissolved in 20 g of chloroform. The solution was spin coated to the copper surface of a clean copper clad epoxy-glass printed circuit board blank. The chloroform was allowed to evaporate leaving a 1.0 mil solid photocurable coating of the admixture on the copper. A negative image-bearing transparency of a printed circuit was placed in contact with and over the coating, and the photocurable coating was exposed through the transparency to UV radiation from 8,000 watt Ascorlux pulsed xenone arc lamp at a surface intensity of 4000 microwatts/cm$^2$ for about 1 minute. The major spectral lines of this lamp arc are all above 3000 A. The negative transparency was removed and the coating was washed in 1,1,1-trichloroethane to remove the unexposed, uncured portion thereof, thus exposing the copper thereunder. The imaged circuit board was then etched by spraying it with a ferric chloride solution 38° Baumé for about 5 minutes at 60°C to remove the exposed copper, followed by a water wash. The cured photoresist coating was then removed in methylene chloride solution, thus revealing the desired copper electrical circuit.

Example 17

Example 15 was repeated except that 2.9 g of Polythiol C from Example 8 was used in place of Polythiol B. The results were substantially the same.

Example 18

A mixture containing 2.7 g of solid Polyene C from Example 4, 3.3 g of solid Polythiol A from Example 5, 0.1 g of dibenzosuberone, 0.025 g of octadecyl β-(4-hydroxy-3,5-di-t-butyl phenyl) propionate commercially available from Geigy-Ciba under the tradename "Irganox 1076", 0.001 g of phosphorous acid and 0.025 g of 2,6-ti-tert-butyl-4-methylphenol, an antioxidant commercially available under the tradename "Ionol" from Shell Chemical Co. was dissolved in chloroform.

The solution was spin coated to the surface of 6 mil thick cold rolled steel sheet. The chloroform was allowed to evaporate leaving a 1.0 mil solid photocurable coating of the admixture on the steel sheet. A negative image-bearing transparency was placed in contact with and over the coating which showed good adhesion to the steel surface, and the photocurable coating was exposed through the transparency to UV radiation from 8,000 watt Ascorlux pulsed xenon arc lamp at a surface intensity of 4000 microwatts/cm$^2$ for about 1 minute. The major spectral lines of this lamp are all above 3000 A. The negative transparency was removed and the coating was washed in 1,1,1-trichloroethane to remove the unexposed, uncured portion thereof, thus exposing the surface of the steel sheet thereunder. The steel sheet was treated on the surface containing the cured photoresist by spraying with a ferric chloride solution 42° Baumé at 50°C. After about 15 minutes all the exposed steel sheet was etched through its entire thickness by the chemical milling reaction.

The molecular weight of the polyenes and polythiols of the present invention as well as the starting styrene-allyl alcohol polymer materials of this invention may be measured by various conventional methods including solution viscosity, osmotic pressure and gel permeation chromatography. Additionally, the molecular weight may be calculated from the known molecular weight of the reactants.

As can be seen from the above detailed description, the subject solid curable and particularly photocurable compositions comprised of compatible solid polyenes and solid polythiols having similar polymeric backbones based on styrene-allyl alcohol copolymers exhibit extremely satisfactory chemical and physical properties and are versatile curable polymeric systems which do not possess the many drawbacks of liquid curable polymer compositions.

A desirable characteristic of these solid photocurable polyene-polythiol compositions is that solid films of the same may be formed easily by known film forming techniques and the solid photosensitive film can be packaged as a sandwich between removable protective cover sheets such as polyolefin, films and a flexible, usually UV transparent, support polymeric film composed of polyesters, cellulose esters, polyamides, etc. In this manner, they can be easily stored and handled and when ready for use can be directly laminated, usually under pressure and heat, to the desired solid surface, e.g., metal clad printed circuit board. The solid uncured polyene-polythiol composition adhere very satisfactorily to various surfaces, particularly to copper.

It is understood that the foregoing detailed description is given merely by way of illustration and that many variations may be made therein without departing from the spirit of this invention.

What is claimed is:
1. A process which comprises:
   A. applying to the surface of a substrate a solid layer of a curable composition consisting essentially of
      1. a solid polyene containing at least 2 reactive unsaturated carbon to carbon bonds per molecule selected from the group consisting of polyene compounds having the general formula:

(I)
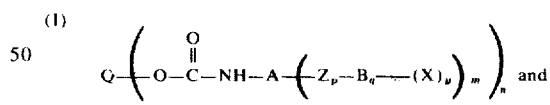

and (II)
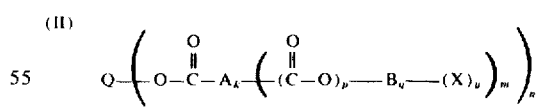

wherein Q is a styrene-allyl alcohol copolymeric moiety remaining after n hydroxyl groups of a styrene-allyl alcohol copolymer have reacted to form (i) n urethane linkages in Formula I and (ii) n ester linkages in Formula II; A and B are polyvalent organic radical members free of reactive carbon to carbon unsaturation and are independently selected from the group consisting of aryl, substituted aryl, aralkyl, substituted aralkyl, cycloalkyl, substituted cycloalkyl, alkyl and substituted alkyl containing 1 to 36 carbon atoms and mixtures thereof, said group members can be internally connected to one another by a chemically compatible linkage selected from the group consisting of —O—, —S—, carboxylate, carbonate, carbonyl, urethane and substituted urethane, urea and substituted urea, amide and substituted amide, amine and substituted amine and hydrocarbon; Z is a divalent chemically compatible linkage selected from the group consisting of $$-NH-\overset{O}{\underset{\|}{C}}-O-,$$

—O— and —S—; X is a member selected from the group consisting of:

a. $-(CH_2)_d-CR'=CHR$
b. $-O(CH_2)_d-CR'=CHR$
c. $-S-(CH_2)_d-CR'=CHR$
d. $-(CH_2)_d-C \equiv CR$
e. $-O-(CH_2)_d-C \equiv CR$
f. $-S-(CH_2)_d-C \equiv CR$ and mixtures thereof; where R and R' each are independently selected from the group consisting of hydrogen and methyl radicals; $d$, $k$, $p$ and $q$ are each integers from 0 to 1; $y$ is an integer from 1 to 10; $m$ and $n$ are each integers of at least 1; with the proviso that when $n$ is 1, $y$ or $m$ is at least 2; and 2. a solid polythiol containing at least 2 thiol groups per molecule of the general formula:

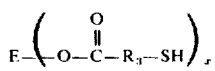

wherein $x$ is an integer of at least 2; E is a styrene-allyl alcohol copolymeric moiety remaining after removal of $x$ hydroxyl groups from a styrene-allyl alcohol copolymer to form $x$ ester linkages; and $R_3$ is a polyvalent organic radical member free of reactive carbon to carbon unsaturation and is selected from the group consisting of aryl, substituted aryl, aralkyl, substituted aralkyl, cycloalkyl, substituted cycloalkyl, alkyl and substituted alkyl groups containing 1 to 16 carbon atoms and mixtures thereof, the total combined functionality of (1) the reactive unsaturated carbon to carbon bonds per molecular in the polyene and (2) the thiol groups per molecule in the polythiol being greater than 4;

B. exposing selected areas of said composition to a free radical generator, thereby curing the exposed areas of said composition; and C. removing the unexposed uncured areas of the curable composition, thereby baring the surface of said substrate beneath the removed uncured areas of the composition.

2. The process of claim 1 wherein
1. said solid polyene is selected from the group consisting of polyene compounds having the formula:

(I)

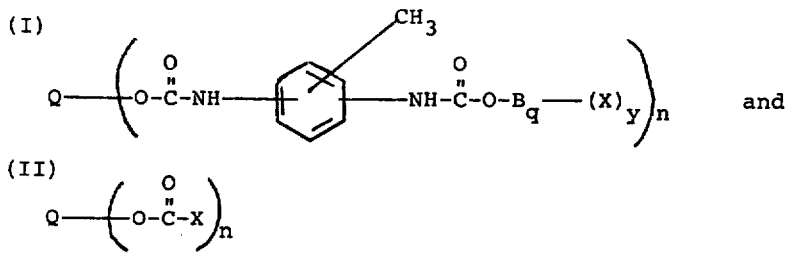

and (II)

wherein in Formula I, B is a polyvalent organic radical selected from the group consisting of

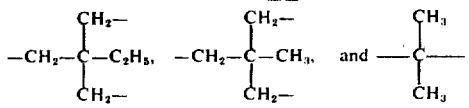

and mixtures thereof; X is a member selected from the group consisting of $-CH_2-CH=CH_2$, $-CH_2CH=CHCH_3$, $-O-CH_2-CH=CH_2$ and $-CH=CH_2$ and mixtures thereof, $y$ is an integer of 1 or 2; and the integers $q$ and $n$ in Formula I and the Q radicals in Formulas I and II have the same meaning as in claim 1; and wherein in Formula II, $n$ is an integer of at least 2 and X is a member selected from the group consisting of $-CH=CH_2$, $-CCH_3=CH_2$, $-CH_2-CH=CH_2$ and mixtures thereof; and (2) the radical $R_3$ in said solid polythiol selected from the group consisting of $-CH_2-$,

$-CH_2CH_2-$ and mixtures thereof; and said styrene-allyl alcohol copolymer reactants having an equivalent weight of about 300 ∓ 130 and a hydroxyl group content from about 4 to 10 percent by weight.

3. A composition of claim 2 wherein said solid polyene is a polyene having Formula I and $q$ is an integer of 0, $n$ is an integer of at least 2 and X member is $-CH_2-CH=CH_2$; and the radical $R_3$ in said solid polythiol is $-CH_2-CH_2-$; said styrene-allyl alcohol reactants having an equivalent weight of about 220 and a hydroxyl group content of about 7.7 percent by weight.

4. The process according to claim 1 wherein the composition is applied to the surface by a lamination process wherein a removable protective carrier film is used to apply said composition as an adherent preformed layer.

5. The process according to claim 1 wherein the composition is applied to the surface as a coating in solution and the solvent is removed.

6. The process according to claim 1 wherein the free radical generator is actinic radiation.

7. The process according to claim 6 wherein the actinic radiation is actinic laser radiation.

8. The process according to claim 6 wherein the actinic radiation is ultraviolet light having a wavelength between about 2000A and about 4000A.

9. The process according to claim 1 wherein at least the surface of said substrate is metallic.

10. The process according to claim 9 further including the steps of: (D) etching the exposed metallic areas of said substrate to the desired depth, and (E) optionally removing the cured areas of said composition.

11. The process according to claim 10 wherein the surface is a metal cladding on an insulating substrate.

12. The process of claim 6 wherein said composition contains from 0.005 to 50 parts by weight of 100 parts by weight of said polyene and said polythiol of a photocuring rate accelerator.

13. The process according to claim 1 further including the steps of (D) depositing a layer of metal onto the bared areas of said surface, and thereafter (E) optionally removing the cured composition from said substrate.

14. The process according to claim 13 wherein the substrate is an insulating substrate.

15. The process according to claim 13 wherein the deposition of said metal is electroless.

16. The process according to claim 13 wherein the surface of said substrate is a metal cladding.

17. The process according to claim 16 wherein in step (E) the cured portion of said composition is removed from said surface, and thereafter the unprotected unplated areas of said metal cladding are etched.

18. The process according to claim 13 wherein said metal is deposited by soldering onto a metallic surface.

19. The process according to claim 1 wherein said substrate is perforated.

20. The process according to claim 1 wherein the substrate is a plastic.

* * * * *